US011947266B2

(12) United States Patent
Brantjes et al.

(10) Patent No.: US 11,947,266 B2
(45) Date of Patent: Apr. 2, 2024

(54) METHOD FOR CONTROLLING A MANUFACTURING PROCESS AND ASSOCIATED APPARATUSES

(71) Applicant: ASML NETHERLANDS B.V., Veldhoven (NL)

(72) Inventors: Nicolaas Petrus Marcus Brantjes, Eindhoven (NL); Matthijs Cox, Valkenswaard (NL); Boris Menchtchikov, Redwood City, CA (US); Cyrus Emil Tabery, San Jose, CA (US); Youping Zhang, Cupertino, CA (US); Yi Zou, Foster City, CA (US); Chenxi Lin, Newark, CA (US); Yana Cheng, San Jose, CA (US); Simon Philip Spencer Hastings, San Jose, CA (US); Maxim Philippe Frederic Genin, San Mateo, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 482 days.

(21) Appl. No.: 17/297,171

(22) PCT Filed: Nov. 14, 2019

(86) PCT No.: PCT/EP2019/081282
§ 371 (c)(1),
(2) Date: May 26, 2021

(87) PCT Pub. No.: WO2020/126242
PCT Pub. Date: Jun. 25, 2020

(65) Prior Publication Data
US 2022/0026810 A1 Jan. 27, 2022

Related U.S. Application Data

(60) Provisional application No. 62/802,866, filed on Feb. 8, 2019.

(30) Foreign Application Priority Data

Dec. 19, 2018 (EP) .................................... 18214013

(51) Int. Cl.
*G03F 7/00* (2006.01)
*G03F 9/00* (2006.01)

(52) U.S. Cl.
CPC ...... *G03F 7/70491* (2013.01); *G03F 7/70633* (2013.01); *G03F 9/7046* (2013.01)

(58) Field of Classification Search
CPC . G03F 7/70491; G03F 7/70633; G03F 9/7046

USPC ..................................................... 430/22, 30
See application file for complete search history.

(56) References Cited

U.S. PATENT DOCUMENTS

| 6,952,253 | B2 | 10/2005 | Lof et al. |
| 11,054,813 | B2 | 7/2021 | Ypma et al. |
| 2013/0035888 | A1 | 2/2013 | Kandel et al. |
| 2019/0384188 | A1 | 12/2019 | Queens et al. |
| 2020/0019067 | A1 | 1/2020 | Kou et al. |

FOREIGN PATENT DOCUMENTS

| CN | 103582819 | 2/2014 |
| CN | 108369412 | 8/2018 |
| CN | 109863456 | 6/2019 |
| EP | 3364247 | 8/2018 |
| TW | 201830154 | 8/2018 |
| WO | 2017060080 | 4/2017 |
| WO | 2018072980 | 4/2018 |

OTHER PUBLICATIONS

International Search Report and Written Opinion issued in corresponding PCT Patent Application No. PCT/EP2019/01282, dated Mar. 4, 2020.
Taiwanese office Action issued in corresponding Taiwanese Patent Application No. 108144626, dated Oct. 8, 2020.
Cekli, H.E. et al.: "A novel patterning control strategy based on real-time fingerprint recognition and adaptive wafer level scanner optimization," Proc. of SPIE, vol. 10585, pp. 105851N-1 to 105851N-11 (Mar. 13, 2018).
Mulkens, J. et al.: "High order field-to-field corrections for imaging and overlay to achieve sub 20-nm lithography requirements," Proc. of SPIE, vol. 8683, pp. 86831J-1 to 86831J-13 (2013).
Menchtchikov B. et al: "Reduction in overlay error from mark asymmetry using simulation, ORION, and alignment models," Proc. of SPIE, vol. 10587 (2018).
Office Action issued in corresponding Chinese Patent Application No. 201980083961.4, dated Nov. 8, 2023.

*Primary Examiner* — Christopher G Young
(74) *Attorney, Agent, or Firm* — Pillsbury Winthrop Shaw Pittman, LLP

(57) ABSTRACT

A method for determining a correction relating to a performance metric of a semiconductor manufacturing process, the method including: obtaining a set of pre-process metrology data; processing the set of pre-process metrology data by decomposing the pre-process metrology data into one or more components which: a) correlate to the performance metric; or b) are at least partially correctable by a control process which is part of the semiconductor manufacturing process; and applying a trained model to the processed set of pre-process metrology data to determine the correction for the semiconductor manufacturing process.

20 Claims, 3 Drawing Sheets

METHOD FOR CONTROLLING A MANUFACTURING PROCESS AND ASSOCIATED APPARATUSES

CROSS-REFERENCE TO RELATED APPLICATIONS

This application is the U.S. national phase entry of PCT Patent Application No. PCT/EP2019/081282 which was filed Nov. 14, 2019, which is based upon and claims the benefit of priority of European Patent Application No. 18214013.7 which was filed on Dec. 19, 2018 and U.S. Patent Application No. 62/802,866 which was filed on Feb. 8, 2019, each of which is incorporated herein in its entirety by reference.

FIELD

The present disclosure relates to processing of substrates for the production of, for example, semiconductor devices.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use radiation. The wavelength of this radiation determines the minimum size of features which can be formed on the substrate. Typical wavelengths currently in use are about 365 nm (i-line), about 248 nm, about 193 nm and about 13 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of about 193 nm.

Low-k1 lithography may be used to process features with dimensions smaller than the classical resolution limit of a lithographic apparatus. In such a process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of a numerical aperture (NA,) a customized illumination scheme, use of one or more phase shifting patterning devices, optimization of the design layout such as optical proximity correction (OPC) in the design layout, or other methods generally defined as resolution enhancement techniques (RET). Additionally or alternatively, one or more tight control loops for controlling a stability of the lithographic apparatus may be used to improve reproduction of the pattern at low k1.

Effectiveness of the control of a lithographic apparatus may depend on characteristics of individual substrates. For example, a first substrate processed by a first processing tool prior to processing by the lithographic apparatus (or any other process step of the manufacturing process, herein referred to generically as a manufacturing process step) may benefit from (slightly) different control parameters than a second substrate processed by a second processing tool prior to processing by the lithographic apparatus.

The accurate placement of patterns on the substrate is a chief challenge for reducing the size of circuit components and other products that may be produced by lithography. In particular, the challenge of measuring accurately the features on a substrate which have already been laid down is a critical step in being able to align successive layers of features in superposition accurately enough to produce working devices with a high yield. So-called overlay should, in general, be achieved within a few tens of nanometers in today's sub-micron semiconductor devices, down to a few nanometers in the most critical layers.

Consequently, modern lithography apparatuses involve extensive measurement or 'mapping' operations prior to the step of actually exposing or otherwise patterning the substrate at a target location. So-called advanced alignment models have been and continue to be developed to model and correct more accurately non-linear distortions of the wafer 'grid' that are caused by processing steps and/or by the lithographic apparatus itself. Not all distortions are correctable during exposure, however, and it remains important to trace and eliminate as many causes of such distortions as possible.

These distortions of the wafer grid are represented by measurement data associated with mark position. The measurement data are obtained from measurements of wafers. An example of such measurements are alignment measurements of alignment marks performed using an alignment system in a lithographic apparatus prior to exposure. Another example of such measurements are overlay measurements of overlay targets performed using a metrology system after exposure.

Machine learning techniques may be utilized to recognize patterns of cause-and-effect between processing context observed impact on one or more characteristics (such as overlay, CD, edge placement error (EPE), etc.) of substrates being subject to a process. These patterns can then be used to predict and correct errors in processing subsequent substrates. Some examples of such systems are described in PCT patent application publication no. WO 2017/060080, hereby incorporated by reference.

SUMMARY

In a first aspect of the invention there is provided a method for determining a correction relating to a performance metric of a semiconductor manufacturing process, the method comprising: obtaining a first set of pre-process metrology data; processing the first set of pre-process metrology data by decomposing the pre-process metrology data into one or more components which: a) correlate to the performance metric; or b) are at least partially correctable by a control process which is part of the semiconductor manufacturing process; and applying a trained model to the processed first set of pre-process metrology data to determine the correction for said semiconductor manufacturing process.

In a second aspect of the invention there is provided a method of obtaining at least one trained model for determining performance metric corrections relating to a performance metric of a lithographic process, the method comprising: obtaining training data comprising a first training set of pre-exposure metrology data comprising dense pre-exposure metrology data, and obtaining a corresponding training set of post processing metrology data relating to said performance metric; processing the training data to obtain processed pre-exposure metrology data comprising one or more components of the pre-exposure metrology data which relate to the performance metric; and training the model with the processed training data.

In a further aspect of the invention, there is provided a computer program comprising program instructions operable to perform the method of the first and/or second aspect when run on a suitable apparatus.

BRIEF DESCRIPTION OF THE DRAWINGS

Embodiments of the invention will now be described, by way of example only, with reference to the accompanying schematic drawings, in which.

DETAILED DESCRIPTION

Figure 1:
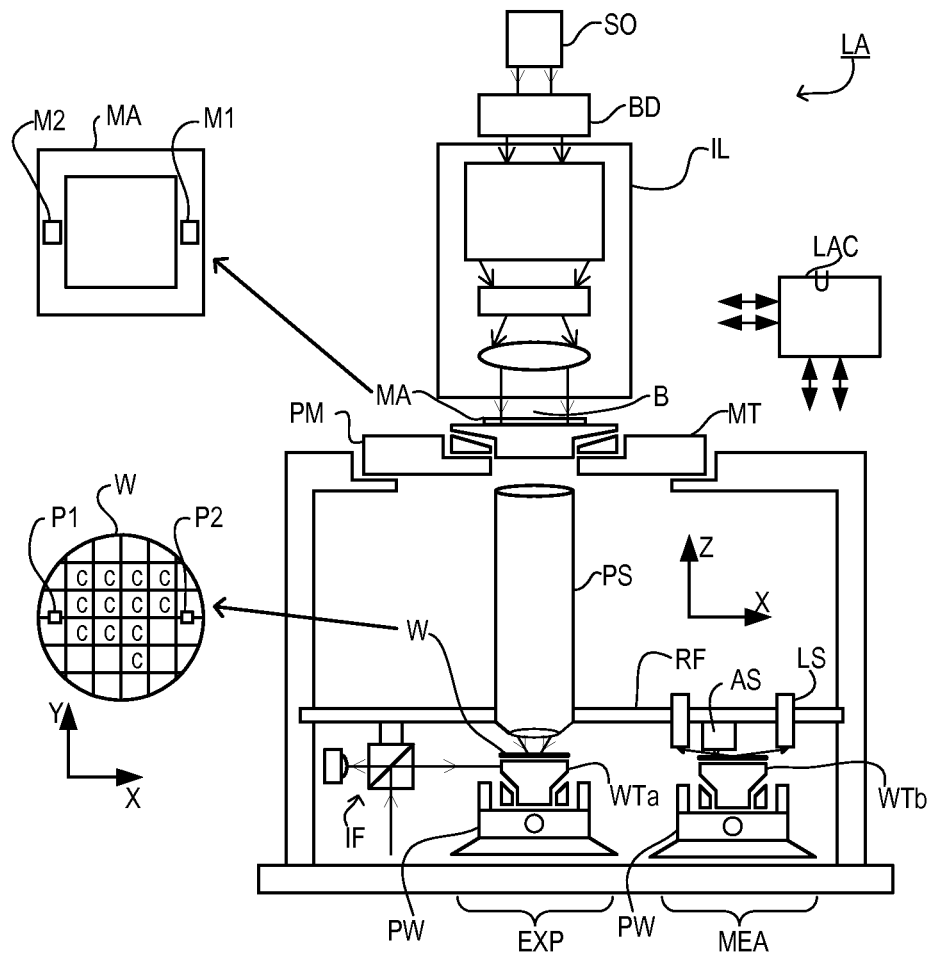
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support (e.g., a mask table) T constructed to support a patterning device (e.g., a mask) MA and connected to a first positioner PM configured to accurately position the patterning device MA in accordance with certain parameters, one or more substrate supports (e.g., a wafer table) WTa and WTb constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

Lithographic apparatus LA in this example is of a so-called dual stage type which has two substrate tables WTa and WTb and two stations—an exposure station and a measurement station—between which the substrate tables can be moved. While one substrate on one substrate table is being exposed at the exposure station EXP, another substrate can be loaded onto the other substrate table at, e.g., the measurement station MEA or at another location (not shown) or can be processed at measurement station MEA. A substrate table with a substrate can be located at measurement station MEA so that various preparatory steps may be carried out. The preparatory steps may include mapping the surface height of the substrate using a level sensor LS and/or measuring the position of alignment marks on the substrate using an alignment sensor AS. The alignment marks are arranged nominally in a regular grid pattern. However, due to inaccuracies in creating the marks and also due to deformations of the substrate that occur throughout its processing, the marks may deviate from the ideal grid. Consequently, in addition to measuring position and orientation of the substrate, the alignment sensor in practice may measure in detail the positions of many marks across the substrate area, if the apparatus LA is to print product features at the correct locations with high accuracy. The measurement of alignment marks can therefore be time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. An embodiment of the invention can be applied in an apparatus with only one substrate table, or with more than two.

In addition to having one or more substrate supports, the lithographic apparatus LA may comprise a measurement stage (not shown). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The apparatus further includes a lithographic apparatus control unit LACU which controls all the movements and measurements of various actuators and sensors of the lithographic apparatus (such as those described). Control unit LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
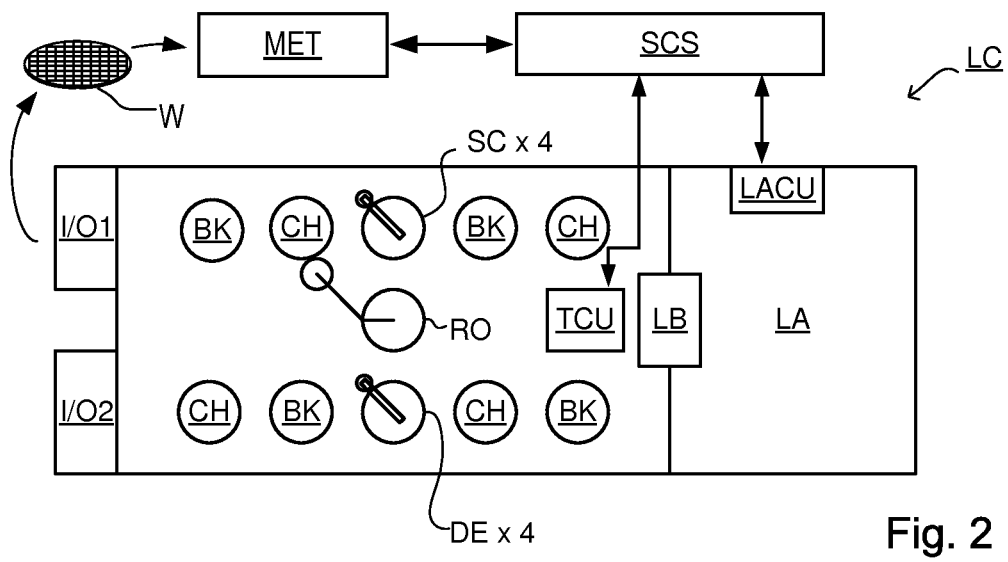
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatuses to perform pre- and post-exposure processes on a substrate W. Conventionally these apparatuses includes one or more spin coaters SC to deposit resist layers, one or more developers DE to develop exposed resist, one or more chill plates CH and one or more bake plates BK, e.g. for conditioning the temperature of substrates W e.g. for conditioning solvents in the resist layers. A substrate handler, or robot, RO picks up substrates W from input/output ports I/O1, I/O2, moves them between the different processing apparatuses and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, one or more inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus MET, which may also be referred to as a metrology apparatus or metrology tool, is used to determine one or more properties of the substrates W, and in particular, how one or more properties of different substrates W vary or how one or more properties associated with different layers of the same substrate W vary from layer to layer. The inspection apparatus may be constructed to identify defects on the substrate W and may, for example, be part of the lithocell LC, or may be integrated into the lithographic apparatus LA, or may even be a stand-alone device. The inspection apparatus may measure the one or more properties on a latent image (an image in a resist layer after the exposure), or on a semi-latent image (an image in a resist layer after a post-exposure bake step), or on a developed resist image (in which the exposed or unexposed parts of the resist have been removed), or even on an etched image (after a pattern transfer step such as etching).

Figure 3:
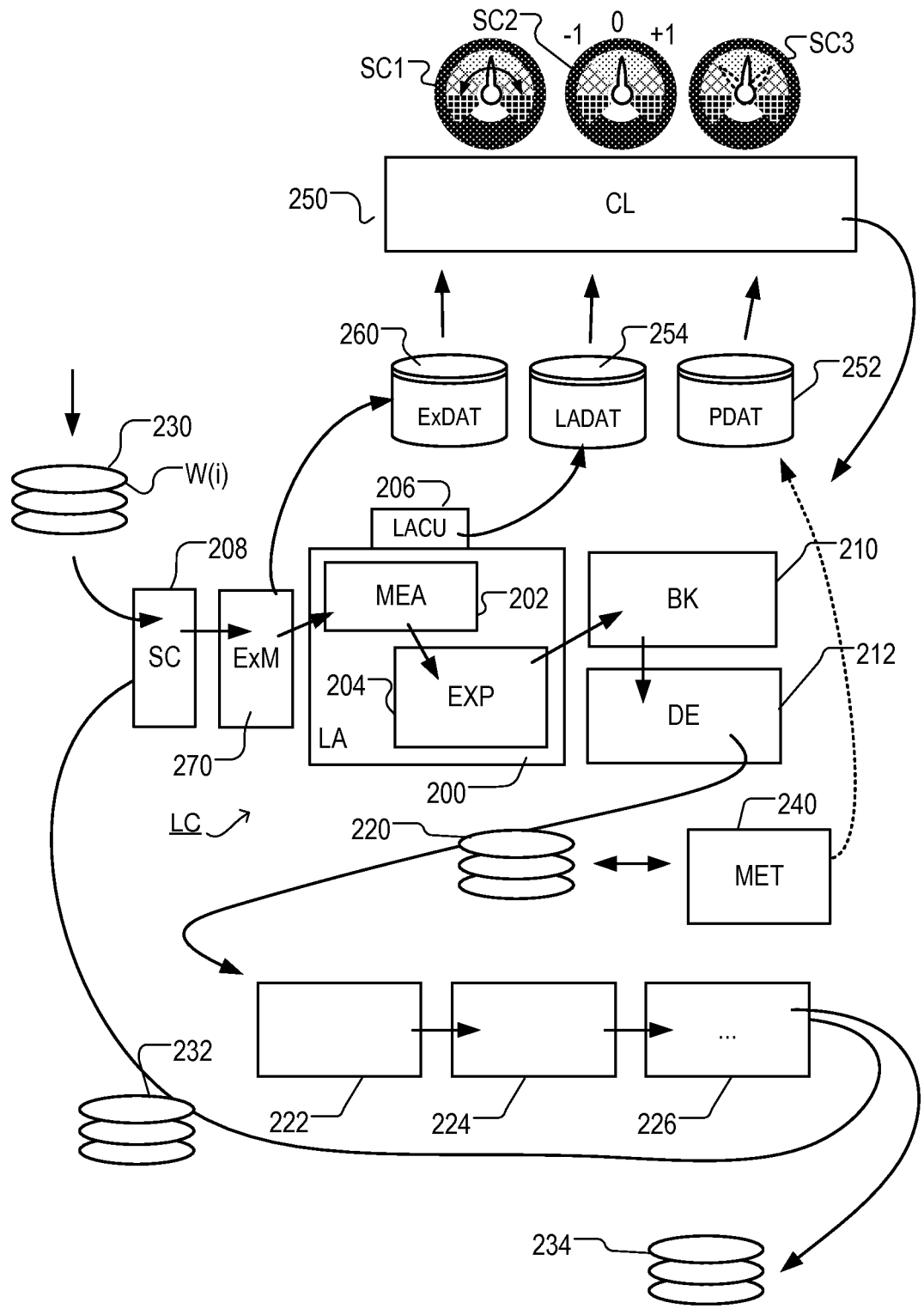
FIG. 3 shows schematically the use of the lithographic apparatus and lithographic cell of FIGS. 1 and 2 together with one or more other apparatuses forming a manufacturing facility for, e.g., semiconductor devices, the facility implementing a control strategy according to an embodiment of the invention.

FIG. 3 shows the lithographic apparatus LA and the lithocell LC in the context of an industrial manufacturing facility for, e.g., semiconductor products. Within the lithographic apparatus (or "litho tool" 200 for short), the measurement station MEA is shown at 202 and the exposure station EXP is shown at 204. The control unit LACU is shown at 206. As already described, litho tool 200 forms part of a "litho cell" or "litho cluster" that also includes a coating apparatus SC, 208 for applying photosensitive resist and/or one or more other coatings to substrate W for patterning by the apparatus 200. At the output side of apparatus 200, a baking apparatus BK, 210 and developing apparatus DE, 212 are provided for developing the exposed pattern into a physical resist pattern. Other components shown in FIG. 3 are omitted, for clarity.

Once the pattern has been applied and developed, patterned substrates 220 are transferred to other processing apparatuses such as are illustrated at 222, 224, 226. A wide range of processing steps are implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

The described semiconductor manufacturing process comprising a sequence of patterning process steps is just one example of an industrial process in which the techniques disclosed herein may be applied. The semiconductor manufacturing process includes a series of patterning steps. Each patterning process step includes a patterning operation, for example a lithographic patterning operation, and a number of other chemical and/or physical operations.

The manufacture of semiconductor devices involves many repetitions of such processing, to build up device structures with appropriate materials and patterns, layer-by-layer on the substrate. Modern device manufacturing processes may comprise 40 or 50 individual patterning steps, for example. Accordingly, substrates 230 arriving at the litho cluster may be newly prepared substrates, or they may be substrates that have been processed previously in this cluster 232 or in another apparatus entirely. Similarly, depending on the required processing, substrates on leaving apparatus 226 may be returned for a subsequent patterning operation in the same litho cluster (such as substrates 232), they may be destined for patterning operations in a different cluster (such as substrates 234), or they may be finished products to be sent for dicing and packaging (such as substrates 234).

Each layer of the product structure typically involves a different set of process steps, and the apparatuses used at each layer may be completely different in type. Further, even where the processing steps to be applied by the apparatuses are nominally the same, in a large facility, there may be several supposedly identical machines working in parallel to perform the processing on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. Parallel processing may also be performed in different chambers within a larger apparatus. Moreover, in practice, different layers often involve different etch processes, for example chemical etch, plasma etch, etc., according to the details of the material to be etched, and special requirements such as, for example, anisotropic etching.

The previous and/or subsequent processes may be performed in other lithography apparatuses, as just mentioned, and may even be performed in different types of lithography apparatus. For example, one or more layers in the device manufacturing process which are very demanding in terms of, e.g., resolution and/or overlay may be performed in a more advanced lithography tool than one or more other layers that are less demanding. Therefore, one or more layers may be exposed in an immersion type lithography tool, while one or more others are exposed in a 'dry' tool. One or more layers may be exposed in a tool working at DUV wavelengths, while one or more others are exposed using EUV wavelength radiation.

Also shown in FIG. 3 is the metrology apparatus (MET) 240 which is provided for making measurements of parameters of the products at desired stages in the manufacturing process. A common example of a metrology station in a modern lithographic manufacturing facility is a scatterometer, for example an angle-resolved scatterometer or a spectroscopic scatterometer, and it may be applied to measure one or more properties of developed substrates at 220 prior to etching in the apparatus 222. Using metrology apparatus 240, performance parameter data PDAT 252 may be determined. From this performance parameter data PDAT 252, it may be further determined that a performance parameter, such as overlay or critical dimension (CD), does not meet specified accuracy requirements in the developed resist. Prior to the etching step, the opportunity exists to strip the developed resist and reprocess one or more of the substrates 220 through the litho cluster. Moreover, the metrology results from the metrology apparatus 240 can be used to maintain accurate performance of the patterning operations in the litho cluster, by making small adjustments over time, thereby reducing or minimizing the risk of products being made out-of-specification, and requiring re-work. Of course, metrology apparatus 240 and/or one or more other metrology apparatuses (not shown) can be applied to measure one or more properties of the processed substrates 232, 234, and/or of incoming substrates 230.

Typically the patterning process in a lithographic apparatus LA is one of the most significant steps in the processing which involves high accuracy of dimensioning and placement of structures on the substrate W. To help ensure this high accuracy, three systems may be combined in a control environment as schematically depicted in FIG. 3. One of these systems is the litho tool 200 which is (virtually) connected to a metrology apparatus 240 (a second system) and to a computer system CL 250 (a third system). A desire of such an environment is to optimize or improve the cooperation between these three systems to enhance an overall so-called "process window" and provide one or more tight control loops to help ensure that the patterning performed by the lithographic apparatus LA stays within a process window. The process window defines a range of values of a plurality of process parameters (e.g. two or more selected from dose, focus, overlay, etc.) within which a specific manufacturing process yields a defined result (e.g. a functional semiconductor device)—typically a range within which the values of the process parameters in the lithographic process or patterning process are allowed to vary while yielding a proper structure (e.g., specified in terms of an acceptable range of CD (such as +−10% of a nominal CD)).

The computer system CL may use (part of) the design layout to be patterned to predict which one or more resolution enhancement techniques to use and to perform computational lithography simulations and calculations to determine which patterning device layout and lithographic apparatus settings achieve a largest overall process window of the patterning process (depicted in FIG. 3 by the double arrow in the first dial SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second dial SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third dial SC3).

Computer system 250 can implement control of the process based on a combination of (i) "pre-processing metrology data" (e.g., including scanner metrology data LADAT 254, and External pre-processing metrology ExDAT 260), associated with substrates before they are processed in a given processing step (for example a lithography step) and (ii) performance data or "post-processing data" PDAT 252 that is associated with the substrates after they have been processed.

A first set of pre-processing metrology data LADAT 254 (referred to herein as scanner metrology data, as it is data generated by the lithographic apparatus LA 200 or scanner) may comprise the alignment data conventionally obtained by the lithographic apparatus LA 200 using alignment sensor AS in the measurement station 202. Alternatively, or in addition to the alignment data, the scanner metrology data LADAT 254 may include height data obtained using level sensor LS, and/or "wafer quality" signals from the alignment sensor AS or the like. As such, the scanner metrology data LADAT 254 may comprise an alignment grid for the substrate, and data relating to substrate deformation (flatness). For example, the scanner metrology data LADAT 254 may be generated by the measurement station MEA 202 of twin stage lithographic apparatus LA 200 (e.g., as this typically comprises the alignment sensor and leveling sensor) in advance of exposure, enabling simultaneous measurement and exposure operations. Such twin stage lithographic apparatus are well known.

Increasingly, (e.g. stand-alone) external pre-exposure metrology tools ExM 270 are used to make measurements before exposure on a lithographic apparatus. Such external pre-exposure metrology tools ExM 270 are distinct from the measurement station MEA 202 of a twin stage lithographic apparatus LA 200. Any pre-exposure measurements performed within the track are also considered to be external measurements. To maintain exposure throughput at a sufficient level, the scanner metrology data LADAT (e.g., alignment grid and substrate deformation grid) measured by measurement station MEA 202 is based on a sparser set of measurements as would be desirable. This typically means such a measurement station is incapable of gathering sufficient measurement data for higher order corrections, and particularly corrections beyond the third order. In addition to this, use of an opaque hard mask can make it difficult to accurately measure the substrate grid in alignment.

External pre-exposure metrology tools ExM 270 enable much denser measurements to be made on each substrate, prior to exposure. Some of these pre-exposure metrology tools ExM 270 measure and/or predict wafer grid deformation at a throughput equal to or faster than the scanner, and with a measurement density much higher than can be achieved using an alignment sensor and level sensor, even when such sensors are comprised within a separate measurement station MEA 202. Pre-exposure metrology tools comprise, for example, substrate shape inspection tools and/or stand-alone alignment stations.

While FIG. 3 shows separate storage 252, 254, 260 for each of the performance data PDAT, scanner metrology data LADAT and external pre-exposure data ExDAT, it will be appreciated that these different types of data may be stored in one common storage unit, or may be distributed over a larger number of storage units, from which particular items of data can be retrieved when required.

It has been observed that, e.g., for tall structures with a large number of film layers (e.g., more than 50, in some cases approaching 100) such as 3D NAND, the stresses imposed by these film layers result in higher order distortions (and in particular in-plane distortions) becoming important. In such processes fifth order errors are seen to be dominant, and it is expected that even higher orders will become significant, also. In these cases, standard wafer alignment (e.g., as performed within the scanner such as by measurement station MEA 202) cannot measure all shapes and/or cannot properly extrapolate the substrate grid, in particular towards the edge of the substrate.

Dense offline post exposure (e.g., overlay) measurements do not precisely match with the actual on-product overlay (OPO) because of differences in alignment, substrate clamping (chucking) and/or clamping models. Also an offline measurement sometimes measures the effect of multiple processing steps, where OPO is only affected by a subset of these steps.

Methods are proposed which can improve prediction of process parameters based on recognition of patterns present within a second set of (e.g., processed) pre-exposure metrology data, wherein the second set of pre-exposure metrology data comprises data from pre-exposure measurements distinct from standard substrate alignment and/or leveling such as performed in a lithographic apparatus (e.g., standard substrate alignment and/or leveling performed inside lithographic apparatus LA 200, and more specifically by measurement station MEA 202). The method comprises using machine learning to train a suitable model which can predict values for a process parameter such as overlay (e.g., specifically OPO) from the second set of pre-exposure metrology data.

More specifically, the second set of pre-exposure metrology data may comprise external pre-exposure data from the one or more external (e.g., stand-alone) pre-exposure metrology stations/tools such as a stand-alone alignment station and/or a substrate deformation metrology station (e.g., one or more external pre-exposure metrology tools ExM 270). As such, the external pre-exposure metrology data may comprise dense alignment data and/or substrate shape data measured by such a tool.

In a more specific embodiment, the external pre-exposure metrology data may comprise processed pre-exposure metrology data, an in particular processed into in-plane distortion data derived from the measurements performed by a pre-exposure metrology tool. Additionally, or alternatively, the processed pre-exposure metrology data may be processed so as to filter out the data relating to the (e.g., standard) alignment model. This comprises removing any data (e.g., shapes/spatial frequencies) which will be corrected for by alignment and/or leveling (e.g., standard alignment and/or leveling strategies and control loops), so as to prevent overfitting and double corrections. Such filtered out data may comprise, for example, the first order content from the external pre-exposure metrology data. However, more complicated alignment strategies may require filtering of other shapes and therefore additional (specific) higher order content.

Figure 4:
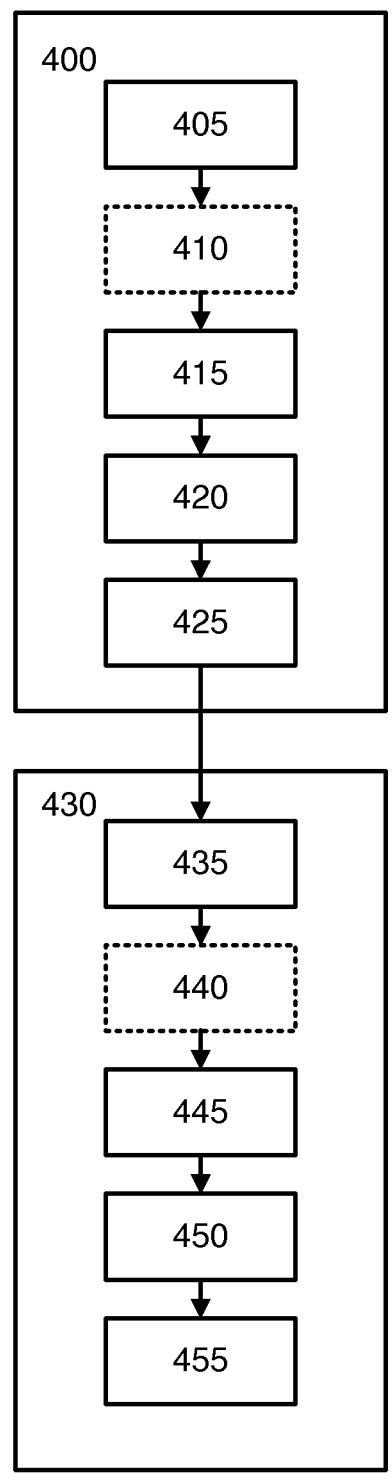
FIG. 4 is a flowchart of a method for calibrating a model, and using said model in process control, according to an embodiment of the invention.

FIG. 4 is a flowchart describing a method according to an embodiment. In a calibration stage 400, training data is obtained at step 405. The training data may comprise external pre-exposure metrology data as described (e.g., a second set of pre-exposure metrology data as distinct from a first set pre-exposure metrology data or scanner metrology data) and corresponding post processing data (e.g., relating to the same substrate(s)), such as overlay data.

At step 410, an optional first pre-processing step comprises converting the external pre-exposure metrology data (e.g., comprise substrate distortion/shape data and/or alignment grid data) into a prediction of in-plane distortion (in-plane distortion data). Such a step may comprise, for example, using a Stoney model or other chucking/clamping model.

At step 415, a second pre-processing step comprises filtering the training data (both external pre-exposure metrology data and post-exposure metrology data/performance data) for alignment model content, i.e., the data (shapes/spatial frequencies) which will be corrected by the alignment model. In a simplest embodiment, the filtered data may comprise first order content for example. This may be the case where (for example) alignment modeling is performed using a 6-parameter alignment model or similar. The filtered data may also comprise data relating to specific higher order shapes/spatial frequencies which will be corrected by the alignment model. This may be the case where (for example) alignment modeling is performed using a higher order alignment model (e.g., higher order wafer alignment HOWA or similar).

Step 415 may comprise, for example, "de-correcting" the post processing data or overlay data for the alignment model correction content. This step may further comprise mimicking the effect of substrate alignment (e.g., the effect of the alignment model used) on the external pre-exposure metrology data and removing the alignment model content from the external pre-exposure metrology data. For example, where the alignment model comprises a 6-parameter model, the processed external pre-exposure metrology data will no longer comprise the a 6-parameter model content, and similarly where the alignment model comprises a HOWA model, the processed external pre-exposure metrology data will no longer comprise the HOWA model content.

At step 420, a feature extraction step is performed (depending on the machine learning method). The feature extraction step 420 may be performed, for example, when the machine learning step 425 is a model mapping step or similar. This step can be dispensed with, however, if the machine learning step relates to training of an artificial intelligence and/or deep learning network. (e.g., neural network). The feature extraction step 420 may comprise selecting predefined features in the (processed) training data for machine learning (e.g. selected Zernikes, polynomials, and/or historical models).

The machine learning step 425 may comprise correlating the external pre-exposure metrology data with the post-exposure metrology data. This may comprise performing model mapping on the extracted features of the previous step. More specifically, such a step may comprise determining a mapping matrix representing correlation between first features extracted from the external pre-exposure metrology data and second features extracted from the post-exposure metrology data. The concept of wafer alignment model mapping is described in the publication by Menchtchikov B. et al: "Reduction in overlay error from mark asymmetry using simulation, ORION, and alignment models" Proceedings Volume 10587, Optical Microlithography XXXI; 105870C (2018), which is incorporated herein by reference.

Alternatively, where this step comprises training an artificial intelligence and/or deep learning network, then no extracted features are required and the processed training data (e.g., which has been processed to at least remove the alignment model content at step 415, and optionally by step 410) can be used directly to train the model using known artificial intelligence training techniques. For example, the training data may comprise the processed external pre-exposure data labeled by its corresponding processed post-exposure data. Whichever machine learning technique is used, the training step will train the model such that it can infer output data relating to process performance (e.g., substrate grid deformations, post-exposure metrology data patterns, traits and/or values (e.g., performance data or overlay patterns, traits and/or values) from the corresponding second or external pre-exposure metrology data patterns, traits and/or values).

A production or actuation stage 430 will now be described. It is proposed that the steps of production or actuation stage 430 are performed per substrate in a substrate-to-substrate control as part of a feed-forward control method. As such, per substrate, predicted overlay and/or consequent corrections can be determined pre-exposure based on external pre-exposure metrology data relating to that substrate, and then used to improve the exposure on that substrate (i.e., correct for the predicted overlay error).

The production or actuation stage 430 comprises a data collection step 435, where second or external pre-exposure metrology data is measured per-substrate (e.g., production substrates) as part of a manufacturing process. Optional first pre-processing step 440 (converting the external pre-exposure metrology data into in-plane distortion data) and second pre-processing step 445 (removing the alignment model content from the external pre-exposure metrology data obtained at step 435) mirror the equivalent steps 410, 415 in the calibration phase 400. As such, first pre-processing step 440 needs only be performed if the model was calibrated for such in-plane distortion data (e.g., step 410 was performed). The feature extraction step 450 also mirrors the equivalent step of the calibration phase 400, and therefore comprises selecting predefined features in the (processed) external pre-exposure metrology data which the model has been trained on. This step is not performed if the model was not trained using extracted features.

At step 455, the trained model is applied, per substrate, to the (processed) external pre-exposure metrology data, to predict post-processing metrology (e.g., grid deformations and/or overlay). These can then be used to determine corresponding corrections during exposure. This step may comprise, for example, using the trained model to predict the effects of performing high order control (e.g., high order alignment control) on OPO. Where the trained model is an artificial intelligence (e.g., trained neural network) this step may comprise inputting the processed external pre-exposure metrology following step 445 into the trained model such that it outputs predicted OPO or a related metric.

For model mapping techniques, step 455 may be achieved, for example, by simulating the effect of the trained model on OPO. This might comprise applying the model to effectively simulate the effect of higher order alignment control (e.g., a higher order alignment model) on the to-be-actuated overlay corrections (e.g., standard overlay corrections as determined from previous substrates and/or lots, but "de-corrected" for the effect of the standard alignment control). This may comprise firstly simulating the effect of the higher order alignment model on grid distortions (e.g., in-plane distortions) to determine a simulated distortion model and mapping this distortion model to OPO, to determine OPO corrections. The higher order alignment control may be simulated based on a number of different alignment models for robustness. Higher order alignment model may be (or include) a model above $3^{rd}$ order, for example.

As such, this step can predict the overlay contribution (substrate grid deformation contribution) which results from, for example, pre-exposure substrate effects such as distortion (e.g., film induced stresses), and which is not corrected by the standard alignment/leveling control loop (e.g., higher order effects). Note that, while most of the embodiments describe processing to remove alignment components, the processing may equally, for example, remove a focus contribution of scanner (which will be corrected using standard focus levelling control) from a first set of pre-processing metrology data comprising a wafer height map. A trained model can then be applied to the processed wafer height map to determine correction of alignment, overlay or other parameter.

While the above description relates to embodiment where the first set of pre-processing metrology data comprises externally measured data, the concepts herein are not so limited. The concepts herein are equally applicable to embodiments where a first set of pre-processing metrology data (e.g., dense data) is measured within the scanner, but for which control components are removed which are separately corrected by a separate control process (e.g., alignment). A combination of the two approaches is also possible, such that the first set of pre-processing metrology data could comprise both data measured externally and internally. This processed internal pre-processing metrology data can then be input into a suitable trained model for prediction of overlay or other parameter. Such internal pre-processing metrology data may comprise, for example, data generated by one or more additional sensors within the scanner (e.g., for horizontal corrections in a similar manner to the level sensor or a hyper-spectral sensor). The data generated by such a sensor may also be used in a feed-forward control co-optimized with alignment the alignment control, using the methods described.

In the above, the processing step predominately comprised removing components which are at least partially correctable by a control process which is part of the lithographic process (e.g., those components which will be corrected by the alignment and/or leveling model. However, the concepts described herein can be more generally applied, so as to identify components within the pre-processing data (e.g., alignment data) which relate to error contributors, and correlating these components to yield. Alignment data is measured for every substrate, for example comprising intensity and substrate displacement measurements. Additionally, typical alignment processes comprise (e.g., simultaneously) performing measurements of alignment marks using radiation comprising a plurality of wavelengths and polarizations and detect at least some of these (e.g., depending on the detection settings), to enable information to be collected regarding measurement accuracy (and e.g., to correct for mark deformities etc.).

It is proposed that the first set of pre-processing metrology data (e.g., wafer alignment and/or leveling data) can be decomposed into fingerprints (i.e., components) comprised within the pre-processing metrology data which better correlates (either alone or in certain combinations) with yield/performance, and therefore are better suited as a basis for scanner corrections compared to the data set as a whole. Decomposition could be performed based on results from a particular setting (e.g., for a particular illumination setting) and/or by using a suitable decomposition technique such as a component analysis technique (e.g., principal component analysis). The fingerprints may be derived from, for example, displacement errors, detection settings (the wavelength, polarizations and combinations thereof detected), and color-to-color fingerprints (which describe differences in a particular target's measured position at each of two detection settings, which of course should be the same) and/or detected signal characteristics (e.g., intensity signatures or components thereof). Each of these components can describe a different component of the process error contributors, which can be individually correlated to yield.

The proposed method may comprise training one or more models, each of which correlates one or more of the components (either separately, or in a particular (e.g., beneficial) combination) to yield. Such a calibration may be performed using a machine learning technique (e.g., as already described) using training data, such as reference/historic yield data and/or error metrology data. The model may comprise, for example, a function of one or more of these components. The calibration may comprise (e.g., prior to the actual training), identifying single components and/or particular combinations of components which have a good correlation with yield, and training the model(s) based on these components and/or combinations. This may be achieved by determining a correlation metric for each of the components and/or combinations, and comparing the correlation metrics.

Once a correlation is established and model trained, the process control can be improved by applying the trained model to the alignment results, to predict yield. By using pre-exposure data, which is specific to each substrate, the yield can be predicted for each substrate before exposure. Based on the substrate-specific predicted yield, scanner corrections can be determined which are targeted to yield optimization, instead of corrections based on minimization of an expected alignment/leveling fingerprint. The corrections, for example, may relate to adjustments to one or more scanner/process setpoints, such that the applied corrections improve yield on a wafer-to-wafer basis.

As such, this embodiment enables yield aware control per wafer. If pre-processing metrology data (e.g., alignment data) from previous layers used, it is proposed (in an embodiment) to combine the models from different (e.g., consecutive) layers, so as to control the process through the stack.

Further embodiments of the invention are disclosed in the two separate lists of numbered clauses below:

First List of Numbered Clauses

1. A method for determining performance metric corrections relating to a performance metric of a lithographic process, the method comprising:
obtaining a first set of pre-exposure metrology data, wherein said first set of pre-exposure metrology data comprises dense pre-exposure metrology data;
processing the first set of pre-exposure metrology data to obtain processed pre-exposure metrology data comprising one or more components of the pre-exposure metrology data which relate to the performance metric; and
applying at least one trained model on said processed pre-exposure metrology data to determine said performance metric corrections for said substrate.

2. A method according to clause 1, wherein said method is performed individually for each substrate in a manufacturing process.

3. A method according to clause 1 or 2, wherein said processing step comprises removing one or more control components which are at least partially correctable by a control process which is part of the lithographic process.

4. A method according to clause 3, wherein the first set of pre-exposure metrology data comprises data related to distortion of the substrate.

5. A method according to clause 3 or 4, wherein said first set of pre-exposure metrology data is of a similar type, but more densely measured, pre-exposure metrology data than that measured for said control process which is part of the lithographic process.

6. A method according to clause 3, 4 or 5, wherein the first set of pre-exposure metrology data has been measured on the substrate by an exposure apparatus which performs the exposure process and control process.

7. A method according to clause 3, 4 or 5, wherein the first set of pre-exposure metrology data has been measured on a substrate in a process external to an exposure process for exposing structures on the substrate.

8. A method according to clause 7, wherein the first set of pre-exposure metrology data comprises at least external alignment data as distinct from a second set of pre-exposure metrology data, the second set of pre-exposure metrology data comprising at least scanner alignment data having been measured on the substrate by an exposure apparatus which performs the exposure process and control process.

9. A method according to clause 7 or 8, wherein the first set of pre-exposure metrology data comprises at least external leveling data as distinct from a second set of pre-exposure metrology data, the second set of pre-exposure metrology data comprising at least scanner leveling data having been measured on the substrate by an exposure apparatus which performs the exposure process and control process.

10. A method according to any of clauses 3 to 9, wherein said one or more control components which are at least partially correctable by a control process which is part of the lithographic process comprise component data related to models and/or spatial frequencies used for alignment performance metric corrections.

11. A method according to clause 1 or 2, wherein the processing comprises decomposing said first set of pre-exposure metrology data to derive said one or more components, such that said one or more components and/or combinations thereof correlates with said performance metric.

12. A method according to clause 11, comprising determining a correlation metric for each of said one or more components and/or combinations thereof, and selecting one or more of said components and/or combinations thereof for said training based on the correlation metric attributed thereto, to obtain said at least one trained model.

13. A method according to clause 11 or 12, wherein each component of said one or more components relates to one or more of: a particular detection setting component, a difference in measured position between two detection settings component, an intensity component, any other detected signal characteristic component, a displacement error component.

14. A method according to clause 11, 12 or 13, wherein the step of applying at least one trained model on said processed pre-exposure metrology data, comprises applying a corresponding model on each of one or more of said components and/or combinations thereof.

15. A method according to any of clauses 11 to 14, wherein the first set of pre-exposure metrology data comprises alignment data and/or leveling data.

16. A method according to clause 15, wherein the first set of pre-exposure metrology data scanner alignment data and/or leveling data having been measured on the substrate by an exposure apparatus which performs the exposure process and control process.

17. A method according to any preceding clause, wherein said step of applying a trained model comprises performing a model mapping based on first features extracted from said processed pre-exposure metrology data, said model mapping being operable to map said first features to corresponding second features previously observed in post processing metrology data relating to said performance metric, said post processing metrology data having been used to train the model.

18. A method according to clause 17, wherein said first features and second features relate to one or more of shapes, polynomial expressions, Zernike expressions, fingerprints or any combination thereof.

19. A method according to any of clauses 1 to 17, wherein the trained model comprises a trained neural network model.

20. A method according to clause 19, comprising:
obtaining training data comprising a first training set of pre-exposure metrology data, equivalent to said first set of pre-exposure metrology data, and obtaining a corresponding training set of post processing metrology data relating to said performance metric, wherein said first set of pre-exposure metrology data is labeled by the corresponding training set of post processing metrology data;
processing the training data in a manner corresponding to said processing of the first set of pre-exposure metrology data, to obtain processed pre-exposure metrology data; and
training the model with the processed training data.

21. A method according to any of clauses 1 to 18, comprising the initial step of training the trained model, said training comprising:
obtaining training data comprising a first training set of pre-exposure metrology data, equivalent to said first set of pre-exposure metrology data, and obtaining a corresponding training set of post processing metrology data relating to said performance metric;
processing the training data in a manner corresponding to said processing of the first set of pre-exposure metrology data, to obtain processed pre-exposure metrology data; and
training the model with the processed training data by correlating the first training set of pre-exposure metrology data with the corresponding training set of post processing metrology data.

22. A method according to clause 21, wherein the correlating step comprises using model mapping to correlate first features extracted from said training set of pre-exposure metrology data to corresponding second features in said training set of post processing metrology data.

23. A method according to clause 22, wherein the training of the model comprises determining a mapping matrix representing correlation between the first features and the second features.

24. A method of obtaining at least one trained model for determining performance metric corrections relating to a performance metric of a lithographic process, the method comprising:
obtaining training data comprising a first training set of pre-exposure metrology data, and obtaining a corresponding training set of post processing metrology data relating to said performance metric;
processing the training data to obtain processed pre-exposure metrology data comprising one or more components of the pre-exposure metrology data which relate to the performance metric; and
training the model with the processed training data.

25. A method according to clause 24, wherein said processing step comprises removing control components which are at least partially correctable by a control process which is part of the lithographic process.

26. A method according to clause 25, wherein said training set of pre-exposure metrology data is of a similar type, but more densely measured, pre-exposure metrology data than that measured for said control process which is part of the lithographic process.

27. A method according to clause 25 or 26, having been measured on a plurality of substrates in a process external to an exposure process to expose structures on the substrate.

28. A method according to clause 27, wherein the first set of pre-exposure metrology data comprises at least external alignment data as distinct from a second set of pre-exposure metrology data, the second set of pre-exposure metrology data comprising at least scanner alignment data having been measured on the substrate by an exposure apparatus which performs the exposure process and preparatory control process.

29. A method according to clause 27 or 28, wherein the first set of pre-exposure metrology data comprises at least external leveling data as distinct from a second set of pre-exposure metrology data, the second set of pre-exposure metrology data comprising at least scanner leveling data having been measured on the substrate by an exposure apparatus which performs the exposure process and preparatory control process.

30. A method according to clause 24, wherein the processing comprises decomposing said first training set of pre-exposure metrology data to derive said one or more components, such that said one or more components and/or combinations thereof correlates with said performance metric.

31. A method according to clause 30, comprising training a model for each of plurality of said one or more of said components and/or combinations thereof.

32. A method according to clause 31, comprising an initial step of determining a correlation metric for each of said one or more components and/or combinations thereof, and selecting one or more of said components and/or combinations thereof for said training based on the correlation metric attributed thereto.

33. A method according to clause 31 or 32, wherein each component of said one or more components relates to one or more of: a particular detection setting component, a difference in measured position between two detection settings component, an intensity component, any other detected signal characteristic component, a displacement error component.

34. A method according to any of clauses 30 to 33, wherein the first set of pre-exposure metrology data comprises alignment data and/or leveling data.

35. A method according to any of clauses 24 to 34, wherein the training of the model comprises correlating the first training set of pre-exposure metrology data with the corresponding training set of post processing metrology data.

36. A method according to clause 35, wherein the correlating step comprises using model mapping to correlate first features extracted from said training set of pre-exposure metrology data to corresponding second features in said training set of post processing metrology data.

37. A method according to clause 36, wherein the training of the model comprises determining a mapping matrix representing correlation between the first features and the second features.

38. A method according to any of clauses 24 to 34, wherein the model comprises a neural network model, and the training data comprises said first set of pre-exposure metrology data labeled by the corresponding training set of post processing metrology data.

39. A method according to any preceding clause, wherein any of said processing steps further comprises an initial step of converting said first training set of pre-exposure metrology data to a prediction of in-plane distortion of the substrate.

40. A method according to any preceding clause, wherein said performance metric comprises an overlay metric or yield metric.

41. A lithographic exposure cell operable to perform the method of any of clauses 1 to 10, comprising:
an external metrology station operable to measure said substrate to obtain the first set of pre-exposure metrology data; and
a lithographic apparatus operable to use said performance metric corrections in exposing a structure on said substrate; and
a processing device operable to perform at least said processing and applying steps.

42. A computer program comprising program instructions operable to perform the method of any of clauses 1 to 40, when run on a suitable apparatus.

43. A non-transient computer program carrier comprising the computer program of clause 42.

44. A processing device operable to run the computer program of clause 42.

45. A method for determining a correction relating to a performance metric of a semiconductor manufacturing process, the method comprising:
obtaining a first set of pre-process metrology data;
processing the first set of pre-process metrology data by decomposing the pre-process metrology data into one or more components which: a) correlate to the performance metric; or b) are at least partially correctable by a control process which is part of the semiconductor manufacturing process; and
applying a trained model to the processed first set of pre-process metrology data to determine the correction for said semiconductor manufacturing process.

46. The method of clause 45, wherein the semiconductor manufacturing process is a lithographic process and the pre-process metrology data is pre-exposure metrology data associated with a substrate subject to the lithographic process, wherein the lithographic process comprises an exposure process for exposing structures to the substrate.

47. The method of clause 46, wherein the one or more components are at least partially correctable by a control process which is part of the lithographic process and the processing further comprises removing the one or more components from the first set of pre-exposure metrology data.

48. A method according to clause 46, wherein said method is performed for each substrate individually which is subject to the lithographic process.

49. A method according to clause 46, wherein the first set of pre-exposure metrology data comprises data related to distortion of the substrate.

50. A method according to clause 47, wherein said first set of pre-exposure metrology data is of a similar type, but more densely measured, pre-exposure metrology data than that measured for said control process which is part of the lithographic process.

51. A method according to clause 47, wherein the first set of pre-exposure metrology data has been measured on a substrate in a process external to the exposure process.

52. A method according to clause 51, wherein the first set of pre-exposure metrology data comprises external alignment data as distinct from a second set of pre-exposure metrology data, the second set of pre-exposure metrology data comprising at least scanner alignment data having been measured on the substrate by an exposure apparatus which performs the exposure process and control process.

53. A method according to clause 51, wherein the first set of pre-exposure metrology data comprises at least external leveling data as distinct from a second set of pre-exposure metrology data, the second set of pre-exposure metrology data comprising at least scanner leveling data having been measured on the substrate by an exposure apparatus which performs the exposure process and control process.

54. A method according to clause 47, wherein said one or more components which are at least partially correctable by a control process which is part of the lithographic process comprise component data related to models and/or spatial frequencies used for alignment performance metric corrections.

55. A method according to clause 45 or 46, wherein said step of applying a trained model comprises performing a model mapping based on first features extracted from said processed pre-exposure metrology data, said model mapping being operable to map said first features to corresponding second features previously observed in post processing metrology data relating to said performance metric, said post processing metrology data having been used to train the model.

56. A method according to clause 46, wherein the trained model comprises a trained neural network model.

57. A method according to clause 56, comprising:
obtaining training data comprising a first training set of pre-exposure metrology data, equivalent to said first set of pre-exposure metrology data, and obtaining a corresponding training set of post processing metrology data relating to said performance metric, wherein said first set of pre-exposure metrology data is labeled by the corresponding training set of post processing metrology data;
processing the training data in a manner corresponding to said processing of the first set of pre-exposure metrology data, to obtain processed pre-exposure metrology data; and
training the model with the processed training data.

58. A method according to clause 46, comprising the initial step of training the trained model, said training comprising:
obtaining training data comprising a first training set of pre-exposure metrology data, equivalent to said first set of pre-exposure metrology data, and obtaining a corresponding training set of post processing metrology data relating to said performance metric;
processing the training data in a manner corresponding to said processing of the first set of pre-exposure metrology data, to obtain processed pre-exposure metrology data; and
training the model with the processed training data by correlating the first training set of pre-exposure metrology data with the corresponding training set of post processing metrology data.

59. A method of obtaining at least one trained model for determining corrections relating to a performance metric of a lithographic process, the method comprising:
obtaining training data comprising a first training set of pre-exposure metrology data, and obtaining a corresponding training set of post processing metrology data relating to said performance metric;
processing the training data to obtain processed pre-exposure metrology data comprising one or more components of the pre-exposure metrology data which correlate to the performance metric; and
training the model with the processed training data.

60. A method according to clause 59, wherein the model comprises a neural network model, and the training data comprises said first set of pre-exposure metrology data labeled by the corresponding training set of post processing metrology data.

61. A method according to clause 45 or 46, wherein said performance metric comprises an overlay metric or yield metric.

62. A computer program comprising program instructions operable to perform the method of clause 45 or 46, when run on a suitable apparatus.

63. A non-transient computer program carrier comprising the computer program of clause 62.

64. A processing device operable to run the computer program of clause 62.

Second List of Numbered Clauses:

1. A method for determining performance metric corrections relating to a performance metric of a lithographic process, the method comprising: obtaining a first set of pre-exposure metrology data, wherein said first set of pre-exposure metrology data comprises dense pre-exposure metrology data; processing the first set of pre-exposure metrology data to remove control components which are at least partially correctable by a control process which is part of the lithographic process, to obtain processed pre-exposure metrology data; and applying a trained model on said processed pre-exposure metrology data to determine said performance metric corrections for said substrate.

2. A method according to clause 1, wherein the first set of pre-exposure metrology data comprises data related to distortion of the substrate.

3. A method according to clause 1 or 2, wherein said set of pre-exposure metrology data is of a similar type, but more densely measured, pre-exposure metrology data than that measured for said control process which is part of the lithographic process.

4. A method according to any preceding clause, wherein the first set of pre-exposure metrology data has been measured on a substrate in a process external to an exposure process for exposing structures on the substrate.

5. A method according to clause 4, wherein the first set of pre-exposure metrology data comprises at least external alignment data as distinct from a second set of pre-exposure metrology data, the second set of pre-exposure metrology data comprising at least scanner alignment data having been measured on the substrate by an exposure apparatus which performs the exposure process and control process.

6. A method according to clause 4 or 5, wherein the first set of pre-exposure metrology data comprises at least external leveling data as distinct from a second set of pre-exposure metrology data, the second set of pre-exposure metrology data comprising at least scanner leveling data having been measured on the substrate by an exposure apparatus which performs the exposure process and control process.

7. A method according to any preceding clause, wherein said method is performed individually for each substrate in a manufacturing process.

8. A method according to any preceding clause, wherein said step of applying a trained model comprises performing a model mapping based on first features extracted from said processed pre-exposure metrology data, said model mapping being operable to map said first features to corresponding second features previously observed in post processing metrology data relating to said performance metric, said post processing metrology data having been used to train the model.

9. A method according to clause 8, wherein said first features and second features relate to one or more of shapes, polynomial expressions, Zernike expressions, fingerprints or any combination thereof.

10. A method according to any of clauses 1 to 8, wherein the trained model comprises a trained neural network model.

11. A method according to clause 10, comprising: obtaining training data comprising a first training set of pre-exposure metrology data, equivalent to said first set of pre-exposure metrology data, and obtaining a corresponding training set of post processing metrology data relating to said performance metric, wherein said first set of pre-exposure metrology data is labeled by the corresponding training set of post processing metrology data; processing the training data to remove control components which are at least partially correctable by a control process which is part of the lithographic process, to obtain processed pre-exposure metrology data; and training the model with the processed training data.
12. A method according to any of clauses 1 to 9, comprising the initial step of training the trained model, said training comprising: obtaining training data comprising a first training set of pre-exposure metrology data, equivalent to said first set of pre-exposure metrology data, and obtaining a corresponding training set of post processing metrology data relating to said performance metric; processing the training data to remove control components which are at least partially correctable by a control process which is part of the lithographic process, to obtain processed pre-exposure metrology data; and training the model with the processed training data by correlating the first training set of pre-exposure metrology data with the corresponding training set of post processing metrology data.
13. A method according to clause 12, wherein the correlating step comprises using model mapping to correlate first features extracted from said training set of pre-exposure metrology data to corresponding second features in said training set of post processing metrology data.
14. A method according to clause 13, wherein the training of the model comprises determining a mapping matrix representing correlation between the first features and the second features.
15. A method of obtaining a trained model for determining performance metric corrections relating to a performance metric of a lithographic process, the method comprising: obtaining training data comprising a first training set of pre-exposure metrology data comprising dense pre-exposure metrology data, and obtaining a corresponding training set of post processing metrology data relating to said performance metric; processing the training data to remove control components which are at least partially correctable by a control process which is part of the lithographic process, to obtain processed pre-exposure metrology data; and training the model with the processed training data.
16. A method according to clause 15, wherein said training set of pre-exposure metrology data is of a similar type, but more densely measured, pre-exposure metrology data than that measured for said control process which is part of the lithographic process.
17. A method according to clause 15 or 16, having been measured on a plurality of substrates in a process external to an exposure process to expose structures on the substrate.
18. A method according to clause 17, wherein the first set of pre-exposure metrology data comprises at least external alignment data as distinct from a second set of pre-exposure metrology data, the second set of pre-exposure metrology data comprising at least scanner alignment data having been measured on the substrate by an exposure apparatus which performs the exposure process and preparatory control process.
19. A method according to clause 17 or 18, wherein the first set of pre-exposure metrology data comprises at least external leveling data as distinct from a second set of pre-exposure metrology data, the second set of pre-exposure metrology data comprising at least scanner leveling data having been measured on the substrate by an exposure apparatus which performs the exposure process and preparatory control process.
20. A method according to any of clauses 15 to 19, wherein the training of the model comprises correlating the first training set of pre-exposure metrology data with the corresponding training set of post processing metrology data.
21. A method according to clause 20, wherein the correlating step comprises using model mapping to correlate first features extracted from said training set of pre-exposure metrology data to corresponding second features in said training set of post processing metrology data.
22. A method according to clause 21, wherein the training of the model comprises determining a mapping matrix representing correlation between the first features and the second features.
23. A method according to clause any of clauses 15 to 19, wherein the model comprises a neural network model, and the training data comprises said first set of pre-exposure metrology data labeled by the corresponding training set of post processing metrology data.
24. A method according to any preceding clause, wherein any of said processing steps further comprises an initial step of converting said first training set of pre-exposure metrology data to a prediction of in-plane distortion of the substrate.
25. A method according to any preceding clause, wherein said performance metric comprises an overlay metric.
26. A method according to any preceding clause, wherein said scanner content comprises data related to models and/or spatial frequencies used for alignment performance metric corrections in said preparatory control process comprising substrate alignment control.
27. A lithographic exposure cell operable to perform the method of any of clauses 1 to 12, comprising: an external metrology station operable to measure said substrate to obtain the first set of pre-exposure metrology data; and a lithographic apparatus operable to use said performance metric corrections in exposing a structure on said substrate; and a processing device operable to perform at least said processing and applying steps.
28. A computer program comprising program instructions operable to perform the method of any of clauses 1 to 26, when run on a suitable apparatus.
29. A non-transient computer program carrier comprising the computer program of clause 28.
30. A processing device operable to run the computer program of clause 28.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc. In that regard, the processed "substrates" may be semiconductor wafers, or they may be other substrates, according to the type of product being manufactured.

Although specific reference may be made in this text to embodiments of the invention in the context of a lithographic apparatus, embodiments of the invention may be used in other apparatus. Embodiments of the invention may form part of a patterning device inspection apparatus, a metrology apparatus, or any apparatus that measures or processes an object such as a wafer (or other substrate) or a mask (or other patterning device). These apparatuses may be generally referred to as lithographic tools. Such a lithographic tool may use vacuum conditions or ambient (non-vacuum) conditions.

In the present document, the terms "radiation" and "beam" are used to encompass all types of radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Although specific reference may have been made above to the use of embodiments of the invention in the context of optical lithography, it will be appreciated that the invention, where the context allows, is not limited to optical lithography and may be used in other applications, for example imprint lithography.

The terms "optimizing" and "optimization" as used herein refers to or means adjusting an apparatus (e.g., a lithography apparatus), a process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for determining a correction relating to a performance metric of a semiconductor manufacturing process, the method comprising:
   obtaining a first set of pre-process metrology data;
   processing the first set of pre-process metrology data, the processing comprising decomposing the pre-process metrology data into one or more components which:
   a) correlate to the performance metric; or
   b) are at least partially correctable by a control process which is part of the semiconductor manufacturing process; and
   applying a trained model to the processed first set of pre-process metrology data to determine the correction for the semiconductor manufacturing process.

2. The method of claim 1, wherein the semiconductor manufacturing process is a lithographic process and the pre-process metrology data is pre-exposure metrology data associated with a substrate subject to the lithographic process, wherein the lithographic process comprises an exposure process for exposing structures on to the substrate.

3. The method of claim 2, wherein the one or more components are at least partially correctable by a control process which is part of the lithographic process and the processing further comprises removing the one or more components from the first set of pre-exposure metrology data.

4. The method as claimed in claim 2, performed for each substrate individually which is subject to the lithographic process.

5. The method as claimed in claim 2, wherein the first set of pre-exposure metrology data comprises data related to distortion of the substrate.

6. The method as claimed in claim 3, wherein the first set of pre-exposure metrology data is of a similar type, but more densely measured, pre-exposure metrology data than that measured for the control process which is part of the lithographic process.

7. The method as claimed in claim 3, wherein the first set of pre-exposure metrology data has been measured on a substrate in a process external to the exposure process.

8. The method as claimed in claim 7, wherein the first set of pre-exposure metrology data comprises external alignment data as distinct from a second set of pre-exposure metrology data, the second set of pre-exposure metrology data comprising at least alignment data having been measured on the substrate by an exposure apparatus which performs the exposure process and control process.

9. The method as claimed in claim 7, wherein the first set of pre-exposure metrology data comprises at least external leveling data as distinct from a second set of pre-exposure metrology data, the second set of pre-exposure metrology data comprising at least leveling data having been measured on the substrate by an exposure apparatus which performs the exposure process and control process.

10. The method as claimed in claim 3, wherein the one or more components which are at least partially correctable by a control process which is part of the lithographic process comprise component data related to one or more models and/or one or more spatial frequencies used for alignment performance metric correction.

11. The method as claimed in claim 1, wherein the applying a trained model comprises performing a model mapping based on first features extracted from the processed pre-exposure metrology data, the model mapping being operable to map the first features to corresponding second features previously observed in post processing metrology data relating to the performance metric, the post processing metrology data having been used to train the model.

12. The method as claimed in claim 1, wherein the trained model comprises a trained neural network model.

13. The method as claimed in claim 12, comprising:
   obtaining training data comprising a training set of pre-exposure metrology data, equivalent to the first set of pre-exposure metrology data, and obtaining a corresponding training set of post processing metrology data relating to the performance metric, wherein the training set of pre-exposure metrology data is labeled by the corresponding training set of post processing metrology data;

processing the training data in a manner corresponding to the processing of the first set of pre-exposure metrology data, to obtain processed pre-exposure metrology data; and training the model with the processed training data.

14. The method as claimed in claim 2, comprising training the trained model, the training comprising:

obtaining training data comprising a first training set of pre-exposure metrology data, equivalent to the first set of pre-exposure metrology data, and obtaining a corresponding training set of post processing metrology data relating to the performance metric;

processing the training data in a manner corresponding to the processing of the first set of pre-exposure metrology data, to obtain processed pre-exposure metrology data; and training the model with the processed training data by correlating the training set of pre-exposure metrology data with the corresponding training set of post processing metrology data.

15. The method as claimed in claim 1, wherein the performance metric comprises an overlay metric or yield metric.

16. A method of obtaining at least one model trained for determining a correction relating to a performance metric of a lithographic process, the method comprising:

obtaining training data comprising a training set of pre-exposure metrology data, and obtaining a corresponding training set of post processing metrology data relating to the performance metric;

processing the training data to obtain processed pre-exposure metrology data comprising one or more components of the pre-exposure metrology data which correlate to the performance metric; and training, by a hardware computer, the at least one model with the processed training data.

17. The method as claimed in claim 16, wherein the model comprises a neural network model, and the training data comprises the training set of pre-exposure metrology data labeled by the corresponding training set of post processing metrology data.

18. A computer program product comprising a non-transitory computer-readable medium having instructions therein, the instructions, when executed by one or more computers, configured to cause the one or more computers to at least:

obtain a set of pre-process metrology data relating to a semiconductor manufacturing process;

decompose the pre-process metrology data into one or more components which:

a) correlate to a performance metric of the semiconductor manufacturing process; or b) are at least partially correctable by a control process which is part of the semiconductor manufacturing process; and apply a trained model to the processed set of pre-process metrology data to determine a correction for the semiconductor manufacturing process.

19. The computer program product of claim 18, wherein the semiconductor manufacturing process is a lithographic process and the pre-process metrology data is pre-exposure metrology data associated with a substrate subject to the lithographic process, wherein the lithographic process comprises an exposure process for exposing structures on to the substrate.

20. A computer program product comprising a non-transitory computer-readable medium having instructions therein, the instructions, when executed by one or more computers, configured to cause the one or more computers to at least:

obtain training data comprising a training set of pre-exposure metrology data for a lithographic process, and obtaining a corresponding training set of post processing metrology data relating to a performance metric of the lithographic process;

process the training data to obtain processed pre-exposure metrology data comprising one or more components of the pre-exposure metrology data which correlate to the performance metric; and train the at least one model for determining a correction relating to the performance metric of the lithographic process, with the processed training data.

* * * * *